(12) United States Patent
Liu

(10) Patent No.: US 11,860,217 B2
(45) Date of Patent: Jan. 2, 2024

(54) TEST CIRCUITS AND SEMICONDUCTOR TEST METHODS

(71) Applicant: CHANGXIN MEMORY TECHNOLOGIES, INC., Hefei (CN)

(72) Inventor: ChihCheng Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 231 days.

(21) Appl. No.: 17/431,132

(22) PCT Filed: Mar. 9, 2021

(86) PCT No.: PCT/CN2021/079634
§ 371 (c)(1),
(2) Date: Aug. 13, 2021

(87) PCT Pub. No.: WO2021/196988
PCT Pub. Date: Oct. 7, 2021

(65) Prior Publication Data
US 2023/0058289 A1 Feb. 23, 2023

(30) Foreign Application Priority Data
Apr. 3, 2020 (CN) .......................... 202010259636.3

(51) Int. Cl.
*G01R 31/02* (2006.01)
*G01R 31/26* (2020.01)
(Continued)

(52) U.S. Cl.
CPC ..... *G01R 31/2642* (2013.01); *G01R 31/2831* (2013.01); *G01R 31/2884* (2013.01);
(Continued)

(58) Field of Classification Search
CPC ............ G01R 31/2642; G01R 31/2884; G01R 31/2858; G01R 31/2886; G01R 31/2831;
(Continued)

(56) References Cited

U.S. PATENT DOCUMENTS 6,320,391 B1 11/2001 Bui
9,329,228 B2 5/2016 Chen et al.
(Continued)

FOREIGN PATENT DOCUMENTS

CN 102590629 A 7/2012
CN 102955121 A 3/2013
(Continued)

OTHER PUBLICATIONS

CN 106409817 Machine Translation Feb. 15, 2017 (Year: 2017).*
(Continued)

*Primary Examiner* — Raul J Rios Russo
(74) *Attorney, Agent, or Firm* — Cooper Legal Group, LLC

(57) ABSTRACT

The present application relates to a test circuit, comprising: M stages of test units, first terminals of test units in each stage being all connected to a power wire, second terminals of test units in each stage being all connected to a ground wire, third terminals of test units in the first stage being connected to the power wire, and third terminals of test units in the $i^{th}$ stage being connected to fourth terminals of test units in the $(i-1)^{th}$ stage; wherein, the M and i are positive integers greater than or equal to 2.

12 Claims, 3 Drawing Sheets

Connect the power wire in the test circuit to a power supply device outside the chip — S11

Monitor the change in voltage and current of the power supply device — S12

Obtain the lifetime of all the electro-migration test elements according to the monitored voltage and current — S13

(51) Int. Cl.
  *G01R 31/28* (2006.01)
  *H01L 21/66* (2006.01)
(52) U.S. Cl.
  CPC .......... *G01R 31/2886* (2013.01); *H01L 22/34* (2013.01); *H01L 2924/00* (2013.01); *H01L 2924/0002* (2013.01)
(58) Field of Classification Search
  CPC ... H01L 22/00; H01L 23/544; H01L 2924/00; H01L 2924/0002; H01L 22/34
  USPC ......... 324/71, 378, 403, 415, 425, 500, 537, 324/762.01
  See application file for complete search history.

(56) References Cited

U.S. PATENT DOCUMENTS

| | | | |
|---|---|---|---|
| 9,952,275 B2 | 4/2018 | Chen et al. | |
| 11,187,740 B2 | 11/2021 | Yang et al. | |
| 2004/0051553 A1* | 3/2004 | Manna | G01R 31/129 324/762.02 |
| 2005/0278677 A1* | 12/2005 | Ang | H01L 22/34 438/18 |
| 2011/0010117 A1* | 1/2011 | Chen | G01R 31/2642 716/136 |
| 2013/0038334 A1 | 2/2013 | Brochu, Jr. et al. | |
| 2013/0049793 A1 | 2/2013 | Chen et al. | |
| 2013/0130415 A1 | 5/2013 | Ahn et al. | |
| 2015/0051851 A1* | 2/2015 | Chen | G01R 31/2601 702/58 |
| 2018/0188316 A1* | 7/2018 | Chen | G01R 31/2858 |
| 2021/0389369 A1* | 12/2021 | Lee | G01R 31/2642 |

FOREIGN PATENT DOCUMENTS

| | | | |
|---|---|---|---|
| CN | 103033740 A | 4/2013 | |
| CN | 103811467 A | 5/2014 | |
| CN | 104576613 A | 4/2015 | |
| CN | 204720446 U | 10/2015 | |
| CN | 105093086 A | 11/2015 | |
| CN | 105445636 A | 3/2016 | |
| CN | 106199195 A | 12/2016 | |
| CN | 106229953 A | 12/2016 | |
| CN | 106409817 A | 2/2017 | |
| CN | 105118798 B | 5/2018 | |
| CN | 108573890 A | 9/2018 | |
| CN | 110140200 A | 8/2019 | |
| KR | 20040006383 A | 1/2004 | |
| KR | 20090050431 A | 5/2009 | |

OTHER PUBLICATIONS

CN 105445636 Machine Translation Mar. 30, 2016 (Year: 2016).*
International Search Report PCT/CN2021/079634 dated Apr. 3, 2020, 10 pages.
Sultan, Musaab Salman, "Electro- and Magneto-Transport Behavior of Template-Released Isolated Ferromagnetic Nanowires" IEEE Transactions on Magnetics, vol. 53, No. 12, Dec. 2017, 10 pages.
First Office Action CN Application No. 202010259636.3, dated Mar. 24, 2022, 15 pages.
Wang, et al., "Design of Electromigration Lifetime Prediction Circuit", vol. 30, May 2012, China Academic Journal Electronic Publishing House, http://www.cnki.net, 5 pages.
Yanni, et al., "A Judgement Method for Electromigration Testing Failure Time", Semiconductor Technology vol. 40, No. 10, China Academic Journal Electronic Publishing House, http://www.cnki.net, pp. 793-797.
Junfei, Zhou, "Research on the Upset Mechanism of CMOS Inverters Induced by the High Power Microwave", http://www.cnki.net, Dec. 2014, 80 pages.
Yang, Zhizhong, "Digital Electronic Technology, Second Edition", Publisher: Higher Education Press, pp. 259-261, Dec. 31, 2003.

* cited by examiner

TEST CIRCUITS AND SEMICONDUCTOR TEST METHODS

CROSS-REFERENCE TO RELATED APPLICATIONS

The present application claims the priority to Chinese Patent Application 202010259636.3, titled "TEST CIRCUITS AND SEMICONDUCTOR TEST METHODS", filed to the State Intellectual Property Office of People's Republic of China on Apr. 3, 2020, which is incorporated herein by reference in its entirety.

TECHNICAL FIELD

The present application relates to the technical field of semiconductors, and in particular, to a test circuit and a semiconductor test method.

BACKGROUND OF THE PRESENT INVENTION

Electro-migration (EM) is one of main failure mechanisms in semiconductor devices. Electro-migration test is an important test to evaluate the performance of semiconductor devices. The conventional electro-migration test structure is to load a long metal wire with constant current. During the test, the higher the current is, the shorter the test time is. However, high test current may lead to unreasonable prediction of the metal lifetime, and high test current may burn the metal due to different mechanisms. However, low current during the test may lead to long test time, and testing one by one may also lead to long test time and lower test efficiency.

SUMMARY OF THE PRESENT INVENTION

In a first aspect of the present application, a test circuit is provided, comprising:
  M stages of test units, the test unit in each stage having a first terminal, a second terminal, a third terminal, and a fourth terminal, the first terminal of the test unit in each stage being connected to a power wire, the second terminal of the test unit in each stage being connected to a ground wire, the third terminal of the test unit in the first stage being connected to the power wire, and the third terminal of the test unit in the $i^{th}$ stage being connected to the fourth terminal of the test unit in the $(i-1)^{th}$ stage; wherein, the M and the i are positive integers greater than or equal to 2.

In a second aspect of the present application, a semiconductor test method is provided, comprising:
  connecting the power wire in the test circuit according to the first aspect of the present application to a power supply device outside the chip;
  monitoring the change in voltage and current of the power supply device; and
  obtaining the lifetime of all the electro-migration test elements according to the monitored voltage and current.

In an embodiment, the change in current of the electro-migration test element ranges from $1\times10^5$ A/cm$^2$ to $1\times10^{10}$ A/cm$^2$.

In a technical solution of the present application, the test circuit can enable all stages of test units to be tested at the same voltage and at the same time. During the test, the electro-migration test elements in the test units in the next stage will be automatically turn on to have electro migration tested after the electro-migration test elements in the test units in the previous stage are burned out. In this way, multiple electro-migration test elements may be tested at the same time, which greatly shortens the test time.

In the technical solution of the present application, the semiconductor test methods can enable tests at the same voltage and at the same time. During the test, the electro-migration test elements in the test units in the next stage will be automatically turn on to have electro migration tested after the electro-migration test elements in the test units in the previous stage are burned out. In this way, multiple electro-migration test elements may be tested in sequence, which greatly shortens the test time.

BRIEF DESCRIPTION OF THE DRAWINGS

In order to better describe and illustrate the embodiments of the present application, reference may be made to one or more drawings. However, the additional details or examples used to describe the drawings should not be considered as any limitation to the concept of the present application or any one of the currently described embodiments or preferred implementations.

FIGS. 2 to 4 show the test principle of the test circuit according to an embodiment of the present application; among which, FIG. 2 is a circuit diagram for testing the electro-migration test elements in the test units in the first stage, and FIG. 3 is a circuit diagram when the electro-migration test elements in the test units in the first stage are burned out, and FIG. 4 is a circuit diagram when the test elements in the test units in the second stage are burned out.

DETAILED DESCRIPTION OF THE PRESENT INVENTION

Figure 1:
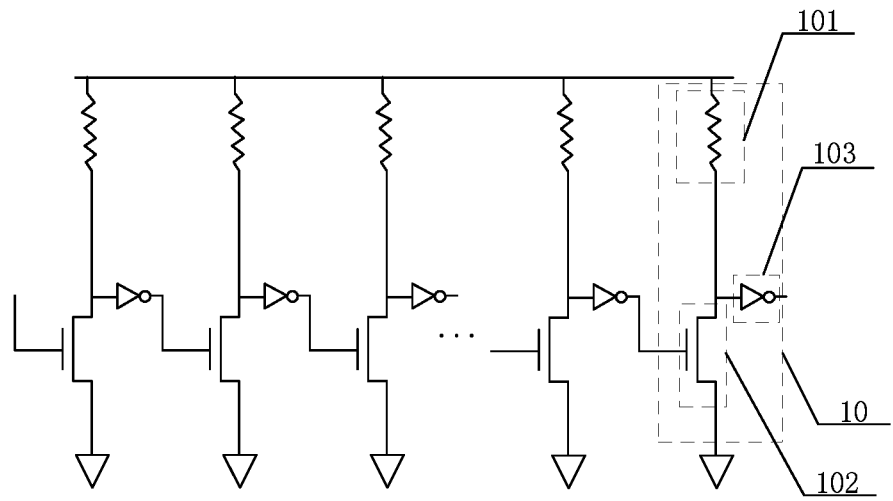
FIG. 1 is a circuit diagram of a test circuit according to an embodiment.

In order to facilitate the understanding of the present application, the present application will be described more fully below with reference to the relevant drawings. Preferred embodiments of the present application are shown in the drawings. However, the present application may be implemented in many different forms and is not limited to the embodiments described herein. On the contrary, these embodiments are provided to make the disclosure of the present application more thorough and comprehensive.

Unless otherwise defined, all technical and scientific terms used herein have the same meaning as commonly understood by a person of ordinary skill in the art to which the present application belongs. Here, terms used in the description of the present application are merely intended to describe specific embodiments, rather than limiting the present application. As used herein, the term "and/or" includes any or all of one or more associated items listed here or combinations thereof.

In the description of the present application, it should be understood that orientations or location relationships indicated by terms such as "upper", "lower", "vertical", "horizontal", "inner", "outer" are the directions and the location relationships illustrated on the basis of the drawings, and used just for convenience of describing the present application and simplifying the description, rather than indicating or implying that the devices or elements must have a specific orientation and be constructed and operated in the specific orientation, and therefore shall not be considered as any limitations to the present application.

As shown in FIG. 1, the present application provides a test circuit comprising: M stages of test units 10, a test unit 10 in each stage having a first terminal, a second terminal, a third terminal, and a fourth terminal, first terminals of test units 10 in each stage being all connected to a power wire (i.e., a line to which the upper terminals of test units 10 in each stage are connected), second terminals of test units 10 in each stage being all connected to a ground wire (not shown), third terminals of test units 10 in the first stage being connected to the power wire, and third terminals of test units 10 in the $i^{th}$ stage being connected to fourth terminals of test units 10 in the $(i-1)^{th}$ stage; wherein, M is a positive integer greater than or equal to 2 and i is a positive integer greater than or equal to 2.

In an example, a test unit 10 in each stage comprises an electro-migration test element 101, a switch 102, and a control circuit 103, wherein a first terminal of the electro-migration test element 101 is the first terminal of the test unit 10 being connected to power wire, a second terminal of the electro-migration test element 101 is connected to a first terminal of the switch 102 and a first terminal of the control circuit 103, a control terminal of the switch 102 is the third terminal of the test unit 10, and a second terminal of the switch 102 is the second terminal of the test unit 10, and a second terminal of the control circuit 103 is the fourth terminal of the test unit 10.

Specifically, the values of M and i may be set according to actual needs and will not be limited here.

In an example, the electro-migration test element 101 may be a metal wire; the length of the electro-migration test element 101 may be set according to actual needs, for example, the length of the electro-migration test element 101 may be 700 μm (micrometers) to 2000 μm; specifically, the length of the electro-migration test element 101 may be 700 μm, 1000 μm, 1500 μm, or 2000 μm. It should be noted that, in a specific embodiment, the length of the electro-migration test element 101 is not limited to the above-mentioned numerical value.

In an example, the electro-migration test element 101 has a first equivalent resistance before being burned, the electro-migration test element 101 has a second equivalent resistance after being burned, and the first equivalent resistance is less than the second equivalent resistance.

In an example, the ratio of the second equivalent resistance to the first equivalent resistance may be set according to actual needs. For example, the ratio of the second equivalent resistance to the first equivalent resistance may be greater than or equal to 100. Specifically, the ratio of the second equivalent resistance to the first equivalent resistance may be 100, 150, 200, 250, 300, etc. It should be noted that, in a specific embodiment, the ratio of the second equivalent resistance to the first equivalent resistance is not limited to the above-mentioned numerical value.

In an optional example, M is greater than or equal to 2, and lengths of the electro-migration test elements 101 in the test units 10 in all stages are the same, and widths of the electro-migration test elements 101 in the test units 10 in all stages are the same. That is, the electro-migration test elements 101 in the test units 10 in all stages are completely the same. In this case, multiple same electro-migration test elements 101 may be tested to analyze the consistency of the electro-migration test elements 101 and improve the accuracy of the test results.

In another optional example, M is greater than or equal to 2, and lengths of the electro-migration test elements 101 in the test units 10 in all stages are different, and widths of the electro-migration test elements 101 in the test units 10 in all stages are the same. That is, the electro-migration test elements 101 in the test units 10 in all stages are different. In this case, multiple different electro-migration test elements 101 with different lengths may be tested in sequence, which significantly shortens the time required for the test of the multiple electro-migration test elements 101 and greatly improves the test efficiency.

In still another example, M is greater than or equal to 2, and lengths of the electro-migration test elements 101 in the test units 10 in all stages are different, and the widths of the electro-migration test elements 101 in the test units 10 in all stages are different. That is, the electro-migration test elements 101 in the test units 10 in all stages are different. In this case, multiple different electro-migration test elements 101 with different lengths and different widths may be tested in sequence, which significantly shortens the time required for the test of the multiple electro-migration test elements 101 and greatly improves the test efficiency.

In yet another example, M is greater than or equal to 2, and lengths of the electro-migration test elements 101 in test units 10 in all stages are not exactly the same, and widths of the electro-migration test elements 101 in test units 10 in all stages are not exactly the same. That is, some of the electro-migration test elements 101 in the test units 10 in M stages are the same and some are different. In this case, multiple different electro-migration test elements 101 may be tested in sequence, which significantly shortens the time required for the test of multiple electro-migration test elements 101 and greatly improves the test efficiency. In addition, multiple same electro-migration test elements 101 may be provided and tested to improve the accuracy of the test structure.

In an example, the electro-migration test element 101 may be a metal wire, a polycrystalline silicon wire, etc., and the metal wire may be one or more of tungsten, aluminum, and copper. The first equivalent resistance value of the electro-migration test element 101 before being turned out is much less than the on-resistance value of the switch 102, for example, the first equivalent resistance value is less than one-tenth of the on-resistance value of the switch 102. The second equivalent resistance value of the migration test element 101 after being burned out is much greater than the on-resistance value of the switch 102, for example, the second equivalent resistance value is greater than ten times the on-resistance value of the switch 102.

In an example, the switch 102 comprises an NMOS transistor, and the gate, drain, and source of the NMOS transistor correspond to the control terminal, the first terminal, and the second terminal of the switch, respectively. That is, the drain of the NMOS transistor is the first terminal of the switch 102 and is electrically connected to the second terminal of the electro-migration test element 101, and the source of the NMOS transistor is the second terminal of the switch 102, which is grounded.

In an example, the control circuit 103 comprises an inverter, and an input terminal and an output terminal of the inverter correspond to the first terminal and the second terminal of the control circuit 103, respectively. That is, the input terminal of the inverter is the first terminal of the control circuit 103 and is electrically connected to the second terminal of the electro-migration test element 101, and the output terminal of the inverter is the fourth terminal of the test unit 10 and is electrically connected to the gate of the NMOS transistor in a test unit 10 in the next stage.

Figure 2:
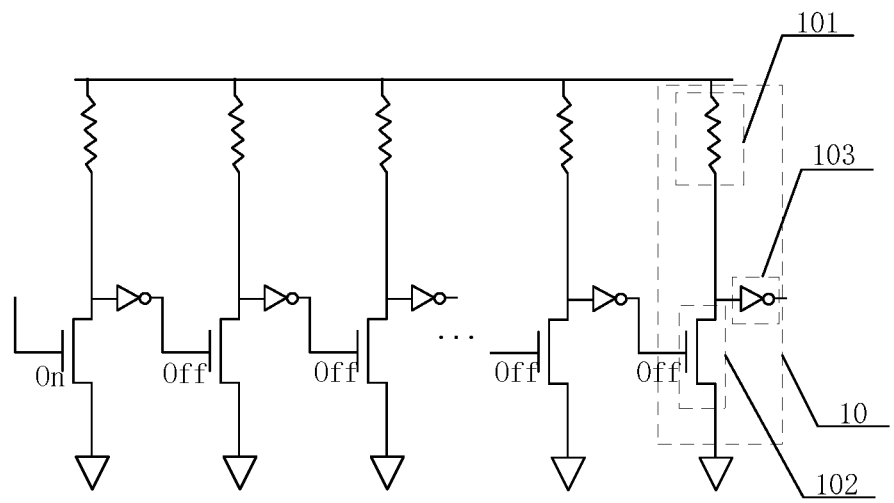
Figure 3:
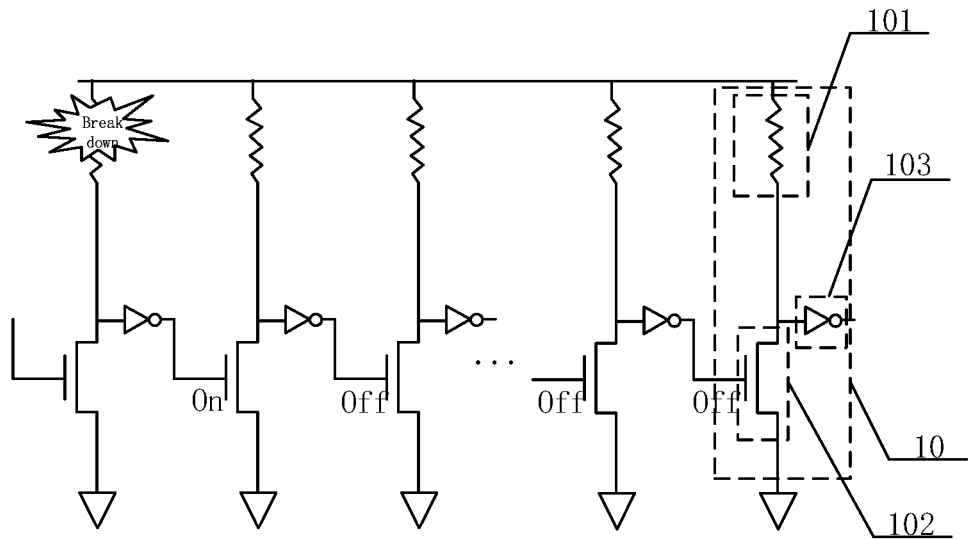
Figure 4:
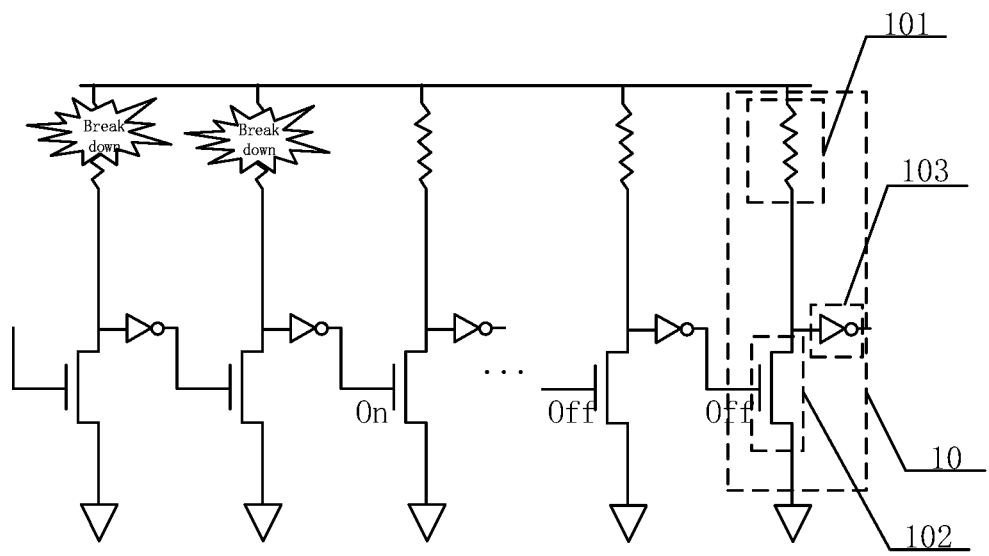

Referring to FIGS. 2 to 4, the test principle of the test circuit of the present application will be described below. First, at the beginning of the test, the gates of the NMOS transistors in the test units 10 in the first stage are connected to the test line, and the NMOS transistors are turned on at this time. That is, the test units 10 in the first stage are turned on to start testing the electro-migration test elements 101 in the test units 10 in the first stage. Since, at this time, the gates of the NMOS transistors in the test units 10 in the second stage to the $M^{th}$ stage are all connected to the output terminals of the inverters in the test units 10 in the previous stage and the electro-migration test elements 101 in the second stage to the $M^{th}$ stage are not burned out, the first terminals of the inverters are at a high level and the second terminals of the inverters are at a low level, and the NMOS transistors in the test units 10 in the second stage to the $M^{th}$ stage are all turned off. That is, at this time, the testing of the electro-migration test elements 101 in the test units 10 in the second stage to the $M^{th}$ stage is not started, as shown in FIG. 2. Then, when the electro-migration test elements 101 in the test units 10 in the first stage are burned out, the first terminals of the inverters in the test units 10 in the first stage become low level and the second terminals of the inverters become high level. At this time, the NMOS transistors in the test units 10 in the second stage are turned on to start testing the electro-migration test elements 101 in the test units 10 in the second stage, as shown in FIG. 3. Then, when the electro-migration test elements 101 in the test units 10 in the second stage are burned out, the first terminals of the inverters in the test units 10 in the second stage become low level and the second terminals of the inverters become high level. At this time, the NMOS transistors in the test units 10 in the third stage are turned on to start testing the electro-migration test elements 101 in the test units 10 in the third stage, as shown in FIG. 4. This process is repeated until the electro-migration test elements 101 in the test units 10 in the $M^{th}$ stage (the last stage of the test circuit) have been tested. It may be known from the above that the test circuit of the present application can automatically perform electro-migration tests on multiple test units 10 in sequence, which greatly improves the test efficiency.

Figure 5:
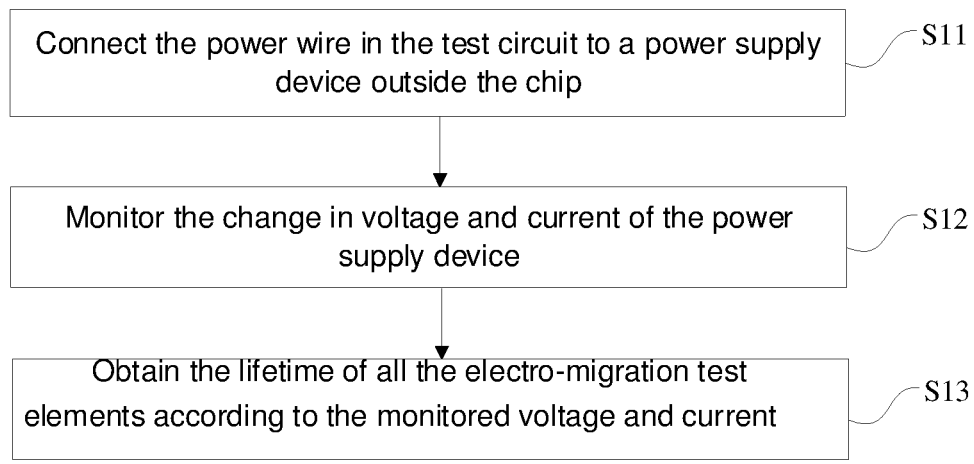
FIG. 5 is a flowchart of a semiconductor test method according to another embodiment.

As shown in FIG. 5, the present application further provides a semiconductor test method, which specifically comprises:

S11: connecting the power wire in the test circuit as shown in FIG. 1 to a power supply device outside the chip;

S12: monitoring the change in voltage and current of the power supply device; and S13: obtaining the lifetime of all the electro-migration test elements according to the monitored voltage and current.

The specific structure of the test circuit has been shown in FIGS. 1 to 4 and described by related text descriptions and will not be repeated here.

In the step S11, after connecting the power wire in the test circuit shown in FIG. 1 to a power supply device outside the chip, a same test voltage is applied to each electro-migration test element 101. First, at the beginning of the test, the gates of the NMOS transistors in the test units 10 in the first stage are connected to the test line, and the NMOS transistors are turned on at this time. That is, the test units 10 in the first stage are turned on to start testing the electro-migration test elements 101 in the test units 10 in the first stage. Since, at this time, the gates of the NMOS transistors in the test units 10 in the second stage to the $M^{th}$ stage are all connected to the output terminals of the inverters in the test units 10 in the previous stage and the electro-migration test elements 101 in the second stage to the $M^{th}$ stage are not burned out, the first terminals of the inverters are at a high level and the second terminals of the inverters are at a low level, and the NMOS transistors in the test units 10 in the second stage to the $M^{th}$ stage are all turned off. That is, at this time, the testing of the electro-migration test elements 101 in the test units 10 in the second stage to the $M^{th}$ stage is not started, as shown in FIG. 2. Then, when the electro-migration test elements 101 in the test units 10 in the first stage are burned out, the first terminals of the inverters in the test units 10 in the first stage become low level and the second terminals of the inverters become high level. At this time, the NMOS transistors in the test units 10 in the second stage are turned on to start testing the electro-migration test elements 101 in the test units 10 in the second stage, as shown in FIG. 3. Then, when the electro-migration test elements 101 in the test units 10 in the second stage are burned out, the first terminals of the inverters in the test units 10 in the second stage become low level and the second terminals of the inverters become high level. At this time, the NMOS transistors in the test units 10 in the third stage are turned on to start testing the electro-migration test elements 101 in the test units 10 in the third stage, as shown in FIG. 4. This process is repeated until the electro-migration test elements 101 in the test units 10 in the $M^{th}$ stage (the last stage of the test circuit) have been tested. It may be known from the above that the test circuit of the present application can automatically perform electro-migration tests on multiple test units 10 in sequence, which greatly improves the test efficiency.

In the step S12, the voltage and current of the power supply device are monitored. The change in voltage and current corresponding to the breakdown of each electro-migration test element 101 is recorded. The change in current on the electro-migration test element ranges from $1 \times 10^5$ A/cm$^2$ to $1 \times 10^{10}$ A/cm$^2$.

In the step S13, the lifetime of all the electro-migration test elements 101 is obtained according to the monitored voltage and current. That is, the lifetime of the electro-migration test elements 101 in the test units 10 in stages may be recorded stage by stage. To record the lifetime of each electro-migration test element 101, timing is started when a test voltage is applied to the electro-migration test element 101. The time from then on to the burning out of the electro-migration test element 101 is the lifetime of the electro-migration test element 101.

Various technical features of the above embodiments can be arbitrarily combined. For simplicity, not all possible combinations of various technical features of the above embodiments are described. However, all those technical features shall be included in the protection scope of the present disclosure if not conflict.

The embodiments described above merely represent certain implementations of the present application. Although those embodiments are described in more specific details, it is not to be construed as any limitation to the scope of the present application. It should be noted that, for a person of ordinary skill in the art, a number of variations and improvements may be made without departing from the concept of the present application, and those variations and improvements should be regarded as falling into the protection scope of the present application. Therefore, the protection scope of the present application should be subject to the appended claims.

The invention claimed is:

1. A test circuit, comprising:
M stages of test units, the test unit in each stage having a first terminal, a second terminal, a third terminal, and a fourth terminal, the first terminal of the test unit in each stage being connected to a power wire, the second terminal of the test unit in each stage being connected to a ground wire, the third terminal of the test unit in a first stage of the stages being connected to the power wire, and the third terminal of the test unit in an $i^{th}$ stage of the stages being connected to the fourth terminal of the test unit in an $(i-1)^{th}$ stage of the stages; wherein, the M and the i are positive integers greater than or equal to 2;

wherein the test unit in each stage comprises an electro-migration test element, a switch, and a control circuit, wherein a first terminal of the electro-migration test element is the first terminal of the test unit, a second terminal of the electro-migration test element is connected to a first terminal of the switch and a first terminal of the control circuit, a control terminal of the switch is the third terminal of the test unit, a second terminal of the switch is the second terminal of the test unit, and a second terminal of the control circuit is the fourth terminal of the test unit.

2. The test circuit according to claim 1, wherein the electro-migration test element has a first equivalent resistance before being burned, the electro-migration test element has a second equivalent resistance after being burned, and the first equivalent resistance is less than the second equivalent resistance.

3. The test circuit according to claim 2, wherein a ratio of the second equivalent resistance to the first equivalent resistance is greater than or equal to 100.

4. The test circuit according to claim 1, wherein a length of the electro-migration test element is 10 μm to 20000 μm.

5. The test circuit according to claim 1, wherein lengths of the electro-migration test elements in the test units in all stages are the same, and widths of the electro-migration test elements in the test units in all stages are the same.

6. The test circuit according to claim 1, wherein lengths of the electro-migration test elements in the test units in all stages are different, and widths of the electro-migration test elements in the test units in all stages are the same.

7. The test circuit according to claim 1, wherein lengths of the electro-migration test elements in the test units in all stages are different, and widths of the electro-migration test elements in the test units in all stages are different.

8. The test circuit according to claim 1, wherein the electro-migration test element comprises a metal wire.

9. The test circuit according to claim 1, wherein the switch comprises an n-type metal-oxide semiconductor (NMOS) transistor, and a gate, a drain, and a source of the NMOS transistor correspond to the control terminal, the first terminal, and the second terminal of the switch, respectively.

10. The test circuit according to claim 1, wherein the control circuit comprises an inverter, and an input terminal and an output terminal of the inverter correspond to the first terminal and the second terminal of the control circuit, respectively.

11. A semiconductor test method, comprising:
connecting the power wire in the test circuit according to claim 1 to a power supply device outside a chip;
monitoring changes in voltage and current of the power supply device; and
obtaining lifetimes of all the electro-migration test elements according to the monitored voltage and current.

12. The semiconductor test method according to claim 11, wherein change in current of the electro-migration test element ranges from $1 \times 10^5$ A/cm$^2$ to $1 \times 10^{10}$ A/cm$^2$.

* * * * *